United States Patent [19]

Heuner et al.

[11] 4,066,918
[45] Jan. 3, 1978

[54] PROTECTION CIRCUITRY FOR INSULATED-GATE FIELD-EFFECT TRANSISTOR (IGFET) CIRCUITS

[75] Inventors: Robert Charles Heuner, Bound Brook; Michael Barnett Goldman, Belle Mead; Stanley Joseph Niemiec, Somerville; George Ira Morton, Belle Mead, all of N.J.

[73] Assignee: RCA Corporation, New York, N.Y.

[21] Appl. No.: 728,223

[22] Filed: Sept. 30, 1976

[51] Int. Cl.² ........................................... H03K 17/00
[52] U.S. Cl. ..................................... 307/304; 357/51; 361/56; 307/200 B; 361/91
[58] Field of Search ............................ 361/56, 91, 110; 307/200 A, 200 B, 304; 330/207 P; 357/51

[56] References Cited

U.S. PATENT DOCUMENTS

3,712,995   1/1973   Steadel ........................... 307/200 B
3,967,295   6/1976   Stewart ............................... 357/51

Primary Examiner—Stanley D. Miller, Jr.
Assistant Examiner—B. P. Davis
Attorney, Agent, or Firm—H. Christoffersen; Henry I. Schanzer

[57] ABSTRACT

The gate insulator of an IGFET, whose gate is connected to the input terminal of a circuit, is protected by limiting the potential difference between any two circuit terminals. Each input and output terminal of the circuit is connected via protective diodes to the power supply lines of the circuit and a high conductivity, low reverse dynamic impedance, diode is connected between the power supply lines. The reverse voltage across the high conductivity diode is less than that of any other diodes at a given current level, whereby only the high conductivity diode conducts substantial currents in the reverse direction.

8 Claims, 4 Drawing Figures

PROTECTION CIRCUITRY FOR INSULATED-GATE FIELD-EFFECT TRANSISTOR (IGFET) CIRCUITS

Insulated-gate field-effect transistors (IGFETS) have an extremely high input impedance resulting from an insulator layer placed over the conduction channel between the gate electrode and the substrate. To operate the transistor at practical voltage levels, the insulator layer has to be made relatively thin. However, a large potential applied across this thin insulator layer causes it to rupture resulting in a short circuit between the gate and the substrate of the transistor, which usually is a catastrophic failure.

The application of a high voltage to the gate may occur either as a result of the application of an input signal of large amplitude or due to the accumulation of static charge on the gate. Due to the high input impedance of the device (typically, the input resistance is greater than $10^{14}$ ohms and the input capacitance is in the order of $10^{-12}$ farads) even a small static charge on the gate is translated into a high potential.

Many different protection networks have been suggested to prevent the rupture of the gate insulator of IGFETs. A known protection network for an input IGFET whose gate is connected to an input terminal includes two diodes connected anode to cathode between the two power supply terminals of the circuit with the common connection between the two diodes being connected to the input terminal. The network also includes a third diode connected between the two power supply lines. The protection network is thus limited to protection diodes extrinsic to the IGFET connected between each input terminal (to which the gate of an IGFET is connected) of the circuit and the power supply lines and between the power supply lines.

To protect the input IGFET against transient signals or static charges generated between the input and output terminals of the circuit, or between the output terminals and the power supply lines, reliance is placed on the intrinsic drain-to-substrate diodes of the input IGFET or other IGFETS whose drains are connected to the output terminals. This presents a problem because the characteristics of the intrinsic diodes are not well defined. In the design of circuits prime consideration is given to the formation of the transistors for normal operating conditions. Consequently, due to circuit design considerations and lay-out constraints, intrinsic diodes may have large series resistance resulting in poor forward current carrying characteristics and high impedances when conducting in the reverse direction. This allows potentials to be developed between the input and output terminals or between the output terminals and the power supply lines which exceed the breakdown potential of the gate insulator of the input IGFETs.

The invention resides, in part, in the recognition that protection circuitry extrinsic to an IGFET must be provided between any two circuit terminals of an IGFET circuit; where the term "terminals" includes the input terminal, the output terminal or the power supply lines or terminals. The extrinsic protection circuitry can be made to have specific and desired characteristics whereby the potential developed between any two terminals can be limited to values below the rupture point of the gate insulator.

IGFET circuits embodying the invention having an input terminal, an output terminal and two power supply lines include diodes, extrinsic to the IGFETs, connected between the output and the power supply lines. The extrinsic diodes are characterized by having series impedances which are substantially less than those of the intrinsic diodes associated with the IGFETs of the circuit.

In the accompanying drawings, like reference characters denote like components.

Figure 1:
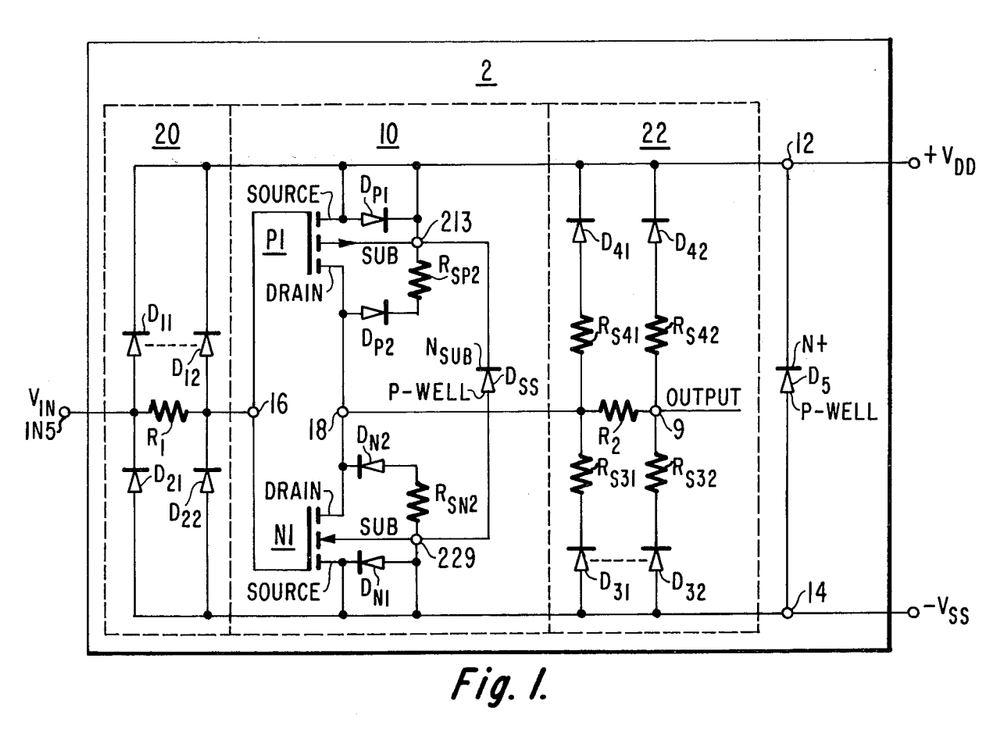
FIG. 1 is a schematic diagram of a circuit embodying the invention.

FIG. 1 shows an integrated circuit 2 which includes an IGFET circuit 10 connected between power supply lines 12 and 14 and which has an input node 16 and an output node 18. The circuit 10 is comprised of IGFETs P1 and N1 interconnected to form a complementary inverter. The gates of transistors P1 and N1 are connected to node 16 and their drains are connected to node 18. The source and substrate of transistor P1 are connected to terminal 12 and the source and substrate of transistor N1 are connected to terminal 14.

Diodes DP1 and DP2 shown connected between the drain and source, respectively, of transistor P1 and line 12 represent, respectively, the intrinsic source-to-substrate and drain-to-substrate diodes of transistor P1. Diodes DN1 and DN2 shown connected between the source and drain, respectively, of transistor N1 and line 14 represent, respectively, the intrinsic source-to-substrate and drain-to-substrate diodes of transistor N1. The substrates of transistors P1 and N1 are directly connected to lines 12 and 14, respectively which shorts out the source-to-substrate diodes DP1 and DN1. The intrinsic drain-to-substrate diodes (DP2, DN2) provide a path between node 18 and line 12 and between line 14 and node 18. In series with diodes DP2 and DN2 there is shown resistors $R_{SP2}$ and $R_{SN2}$ which will be further discussed below. Diode $D_{SS}$ connected between the substrates of transistors P1 and N1 represents the diode formed between the N substrate 213 and P-well regions (e.g., 229). Diode $D_{SS}$ is a large capacitance diode but its reverse breakdown voltage ($V_R$) is typically in the 100 volt range. It therefore, can only serve to protect against stressing potentials above 100 volts.

The gate oxides of IGFETs P1 and N1 are protected by means of protection networks 20 and 22 and diode D5. Input protection network 20 includes: (a) a current limiting resistor R1 connected between input terminal 5 and input node 16; (b) protection diodes D11 and D12 connected at their cathodes to terminal 12 and at their anodes to terminal 5 and node 16, respectively; and (c) protection diodes D21 and D22 connected at their anodes to terminal 14 and at their cathodes to terminal 5 and node 16, respectively.

Output protection network 22, schematically similar to network 20, includes: (a) a resistor R2 connected between internal node 18 and output terminal 9; (b) protection diodes D31 and D32 connected at their anodes to line 14 and at their cathodes to node 18 and terminal 9, respectively; and (c) protection diodes D41 and D42 connected at their cathodes to line 12 and at their anode to node 18 and terminal 9, respectively. In series with diodes D31, D32, D41, and D42, there is shown resistances RS31, RS32, RS41 and RS42, respectively, which will be further discussed below.

Diode D5, connected at its anode to line 14 and at its cathode to line 12, is a diode whose junction is made to have a large area such that it has: a lower forward voltage drop ($V_F$) when conducting in the forward direction and a lower dynamic impedance and a lower reverse voltage ($V_R$) drop when conducting in the reverse direction than any of the other protection diodes in the circuit.

To operate the circuit, a potential of $+V_{DD}$ volts is applied to terminal 12 and a potential of $V_{SS}$ volts is applied to terminal 14, with $+V_{DD}$ being more positive than $V_{SS}$.

Figure 2:
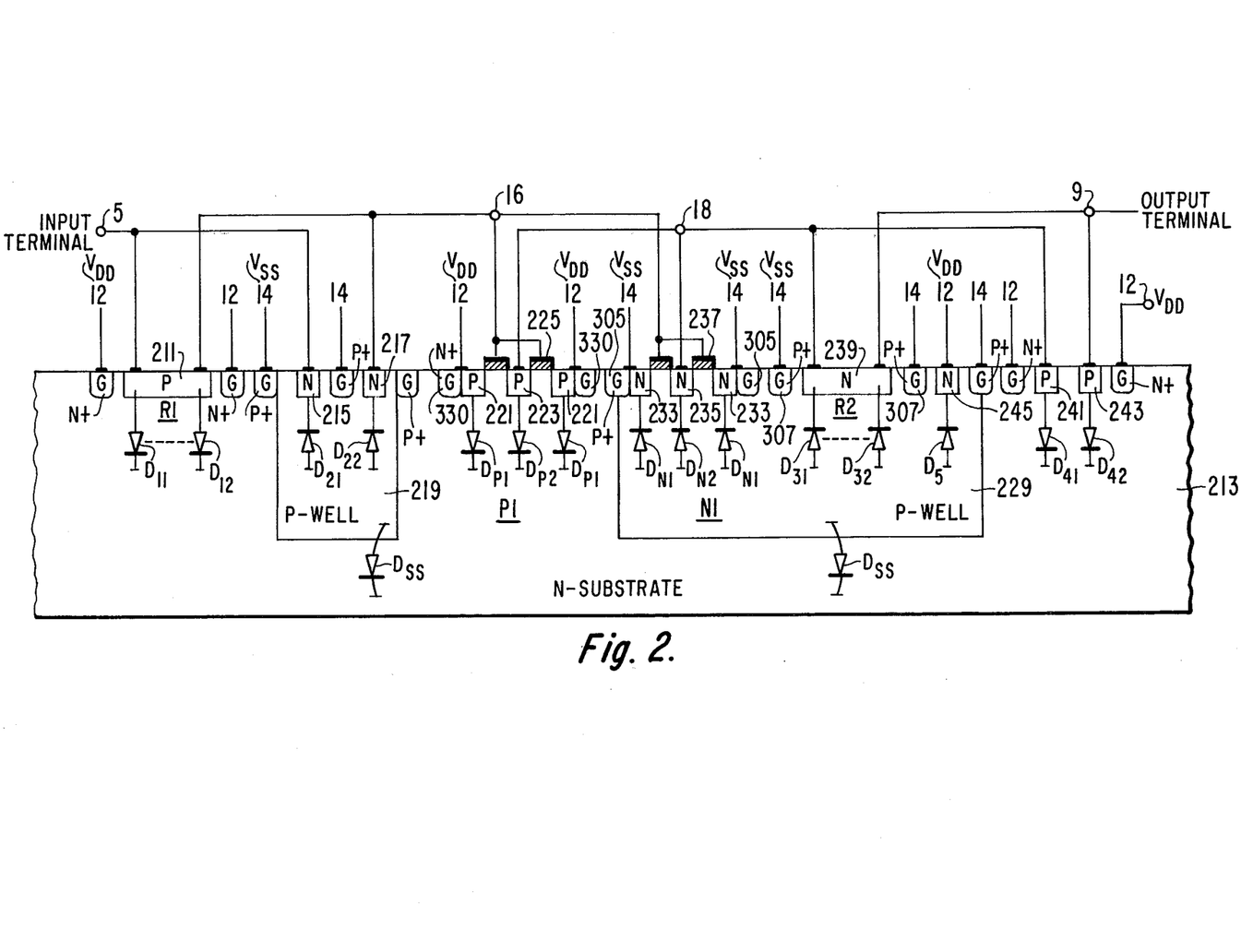
FIG. 2 is a cross sectional diagram of the circuit of FIG. 1.

The circuit of FIG. 1 may be formed as shown in the cross sectional diagram of FIG. 2 which illustrates the formation of diodes inherent in the formation of the transistors and the formation of protection diodes and current limiting resistors extrinsic to the transistors.

The input resistor R1 and diodes D11 and D12 of protection circuit 20 may be formed by diffusing an elongated P-region 211 into an N substrate 213. Intrinsic to the manufacture of resistor R1 is the formation of distributed diode D11–D12 repesented by the dashed lines between the diodes. Diode D11–D12 tends to keep the potential at terminal 5 and node 16 from going more than a few volts positive with respect to the potential on line 12. Diodes D21 and D22 are formed by diffusing N-regions 215 and 217 in P-well 219. These diodes tend to keep the potential at terminal 5 and node 16 from going more than a few volts negative with respect to the potential on line 14. Diode D21 also functions to substantially reduce the current flowing through resistor R1 when the input goes negative with respect to line 14.

Transistor P1 is formed by the diffusion of spaced-apart P-regions 221, 223 in N-substrate 213 and includes a gate electrode 225 formed over the channel region between P-regions 221 and 223. Region 221, the source of transistor P1, is directly connectly to terminal 12 to which is applied $V_{DD}$ while drain region 223 is connected to node 18. Diodes DP1 and DP2 are intrinsic to the formation of the source and drain.

Transistor N1 is formed by spaced apart N-regions 233 and 235 diffused in P-well 229 and includes a gate electrode 237 formed over the channel region between regions 223 and 235. Diodes DN1 and DN2 are intrinsic to the formation of the source and drain.

Resistor R2 of the output protection network is formed by means of an elongated region 239 of N-conductivity diffused in P-well 229. One end of region 239 is connected to the drains (regions 223 and 235) of transistors P1 and N1 and its other end is connected to output terminal 9. Resistor R2 limits the current between output node 18 and output terminal 9. Intrinsic to the formation of region 239 is a distributed diode indicated in FIGS. 1 and 2 by dashed lines between diodes D31–D32. Diode D31–D32 tends to keep the potential at node 18 and terminal 9 from going negative with respect to line 14 by more than a few volts. Diodes D41 and D42 are formed by the diffusion of P-regions 241 and 243 in N substrate 213. These diodes tend to keep the potential at node 18 and terminal 9 from going positive with respect to line 12 by more than a few volts.

Figure 4:
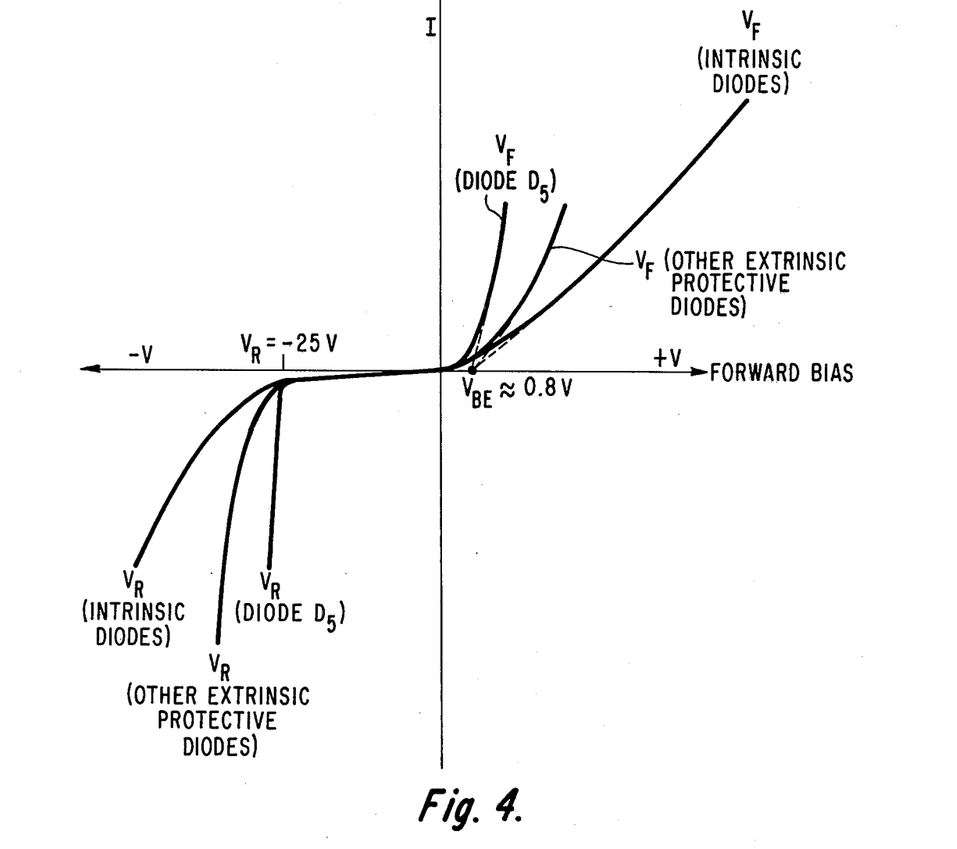
FIG. 4 is a drawing of the voltage-current (V-I) characteristics of diodes shown in the FIGURES.

Diode D5 is formed by diffusion of N region 245 in P-well 229. Although not evident from the drawing, this diode junction is larger than that of any other diodes and the $V_{DD}$ contact to region 245 and the $V_{SS}$ contact to the P+ region surrounding region 245 is made to reduce contact resistance. The forward voltage drop ($V_{F5}$) of diode D5 is less than that of the other protection diodes of the circuit for the same value of current through the diodes as shown in FIG. 4. Also, the reverse breakdown voltage ($V_{R5}$) of diode D5 is, especially at high currents, substantially less than that of the other diodes. This ensures that the other protection diodes of the circuit conduct primarily in the forward direction.

Guard Bands (G) are diffused around various ones of the components to eliminate parasitic effects.

The inadequacy of the prior art protection circuit is best understood by examining the structure and function of the intrinsic diodes associated with the drains of transistors N1 and P1.

Figure 3:
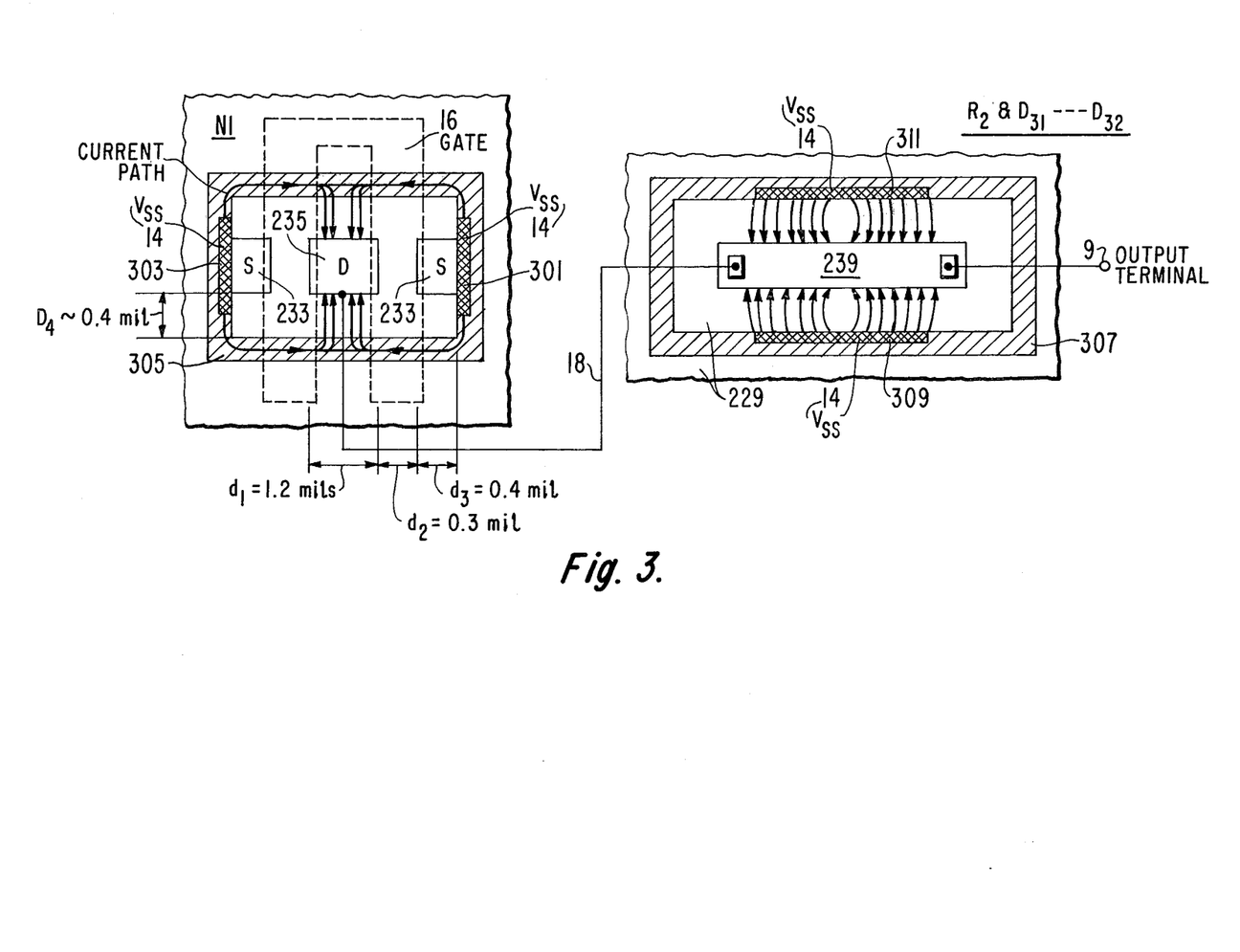
FIG. 3 is a top view of the layout of a portion of the circuit of FIG. 2.

As shown in the layout of FIG. 3, the source region 233 and drain region 235 of transistor N1 diffused in P-well 229 are surrounded by a guard band comprised of P+ region 305. Power distribution of $V_{SS}$ to the sources and to the guard band is made via contacts 301 and 303.

Assuming the absence of the protection circuit 22, when the potential at terminal 14 is more positive than the potential at node 18, due to electrostatic charge or other transient signal condition, current flows from the contact region 301 and 303 adjacent source regions 233, along the P+ guard band region 305, then through the P-well region 229 and across the PN junction formed between the P-substrate 229 and the N-drain region 235, and through the N region 235 into output node 18.

The resistance of the conduction path between output node 18 and line 14 via the drain-to-substrate diode of transistor N1, denoted by lumped component $R_{SN2}$ in FIG. 1, is due primarily to the resistance of the path along P+ region 305 and the path along P-well 229. The value of the resistance may be roughly estimated as follows:

By way of example, in a commercially available circuit (especially designed to have low impedance between its drain and substrate the distance (L) along the P+ region from the contact 301 or 303 to a point opposite the edge of the drain region 235 is about 0.7 mil. The width (W) of the P+ region is typically 0.3 mil and its sheet resistance (K) 60 ohms per square. For these values, the resistance ($K \cdot (L/W)$) between contact 301 or 303 and a point opposite the drain is approximately 140 ohms. Given the possibility of four parallel paths the resistance of this current path is approximately 35 ohms.

As to the resistance along the P-well, the distance (L) between the edge of region 305 and the edge of drain region 235 is 0.4 mil and the width of the drain is approximately 1.2 mils. The sheet resistance (K) of the P-well is, however, in the range of 1000 to 2000 ohms per square. Assuming K to be equal to 1000 ohms per square, the resistance of the path is 333 ohms. Due to parallel conduction paths (both sides of region 235) the resistance is approximately 166 ohms. Thus, $R_{SN2}$ for the example above is approximately 200 ohms.

In an analogous manner, a guard band comprised of N+ region 330 surrounds the source and drain regions of transistor P1 (see FIG. 2). The distribution of $V_{DD}$ is made via contacts connected to region 330 and to the source of transistor P1.

When the potential at node 18 is positive with respect to the potential on line 12, current flows from node 18 through P-region 223, across the PN junction formed with N-substrate 213 along substrate 213 and via the N+ region 330 to the contacts connected to line 12.

The resistance of the conduction path just described is shown in FIG. 1 as lumped component $R_{SP2}$ in series with drain-to-substrate diode DP2. The value of $R_{SP2}$ is approximately equal to $R_{SN2}$.

The values of $R_{SN2}$ and $R_{SP2}$ are such that at high currents (to static discharge or other transient conditions) a substantial potential differential may develop between nodes 14 and 18 or between nodes 12 and 18. Assume, as above, that $R_{SN2}$ is in the order of 200 ohms and that a static discharge current of just 1 ampere flows from $V_{SS}$ into node 18. For this condition, the potential on line 14 may be 200 volts more positive than the potential at node 18. This potential differential appears across the gate insulator of transistor N1 and is sufficient to rupture it. Similarly if $R_{SP2}$ is in the order of 200 ohms and a static discharge current of just 1 ampere flows from node 18 to line 12, the potential at node 18 may be 200 volts more positive than the potential on line 12. This potential differential appears across the gate insulator of transistor P1 and is sufficient to rupture it. It is, therefore, clear that intrinsic drain-to-substrate diodes with their relatively large series impedance cannot adequately protect the gate insulators of the transistors they are intended to protect.

The layout of the gate, source and drain is controlled to a great extent by the need to optimize the response of the transistors under normal operating conditions. This often interferes with the optimum layout for reducing the resistance in series with the drain-to-substrate diode.

For example, as shown in FIG. 3, the necessity to have a gate 16 prevents the placement of contacts as close as possible to the drain region. Thus, $R_{SP2}$ and $R_{SN2}$ may vary from design to design and may have relatively large values of resistance.

Measurements made on presently available commercial circuits indicate that the resistance in series with the drain-to-substrate diodes of output transistors can be very large and can vary from unit to unit over a very wide range of values. From a conceptual standpoint it is thus clear, that reliance on the diodes intrinsic to the transistors which are subject to change from design to design is highly undesirable.

Deficiencies of the prior art circuit are overcome by use of protection diodes extrinsic to the transistors as may be seen by examining the structure forming resistor R2 and diodes D31-D32 shown in FIGS. 2 and 3.

FIG. 3 also shows a top view of region 239 diffused in P-well 229 surrounded by P+ region 307, to which are made contacts 309 and 311 for the application thereto of power supply line 14. There are no constraints with regard to the placement of contacts as with the manufacture of the transistors. Relatively long contacts 309 and 311 can be made on at least two sides of the P+ region 307. When the potential on line 14 goes positive with respect to node 18, current can flow from the contacts through the P-well region 229 (between the contacts and region 239) across the PN junction between regions 229 and 239 and then to node 18 or terminal 9. By way of example, assume that the contact 309 and 311 are 2 mils wide (W) and the distance (L) between the edge of the contacts and the edge of region 239 is 0.4 mil. Assuming, as above, the sheet resistivity of the P-well to be 1000 ohms per square, the resistance (K(L/W)) of the conduction path between the contacts 309, 311 and node 18 or terminal 9 is approximately 100 ohms (due to parallel conduction paths between the contacts and region 239).

The "extrinsic" protection diodes (i.e., all those diodes which are not part of the transistors) are formed with their guard bands as close as possible (less then 0.4 mils where feasible) to the region of opposite conductivity type and with the longest possible contacts to reduce the series resistance. Consequently, for the values discussed above, the resistances of $R_{S31}$, $R_{S32}$, $R_{S41}$ and $R_{S42}$ are in the range of 100 ohms compared to 200 ohms for $R_{SN2}$ and $R_{SP2}$. In sharp contrast to the extrinsic diodes intrinsic to the transistors, the resistances in series with the diodes can be tailored (e.g., by increasing the length and/or number of contacts) and be made uniform from unit to unit without affecting the normal response of the transistors.

For purpose of comparison to prior art circuits, note that the extrinsic diodes (e.g., D41 and D42) with their associated resistors (e.g., $R_{S41}$, $R_{S42}$) are in parallel with the intrinsic diode (e.g., $D_{p2}$) and its associated resistor. For the values above, even if only one extrinsic diode (e.g., D41) were connected in the circuit there would be a three-to-one improvement in circuit protection. With only an intrinsic diode ($D_{p2}$ alone), a 0.5 ampere current would cause a 100 volt drop between node 18 and node 12. With extrinsic diode D41 or D42 in the circuit at least 1.5 amperes would have to flow to generate a 100 volt drop between nodes 18 and terminal 12. With diodes D41 and D42 in the circuit approximately 2.5 amperes would have to flow to generate a 100 volt drop. Based on a human body equivalent resistance of approximately 1.5 kilohms, the circuit of the invention can withstand approximately a 4 kilovolt discharge compared to approximately a 1.5 kilovolt discharge for prior art circuits.

The effect of the different values of series resistance on the forward and reverse current carrying characteristics of the diodes intrinsic and extrinsic to the transistors is shown, to a rough approximation, in FIG. 4.

It is evident from FIG. 4, that the extrinsic diodes in parallel with the intrinsic diodes will conduct most of the current and will, in addition, limit the voltage drop across the parallel paths. The voltage drop across the diodes ($V_F$ and $V_R$) includes the contribution of the product of the series resistance, and current through the diodes. For purpose of discussion, it is assumed that the forward voltage ($V_F$) across a diode as it begins to conduct is $V_{BE}$ ($\approx 0.8$ volts). As the current through the diode increases, its $V_F$ increases principally as a function of its series resistance. But, when conducting in the forward direction the series resistance decreases due to conductivity modulation. The minimum value of the resistance being limited by the resistance of the guard band. This is the reason why the protection diodes are more effective in the forward direction and are (other than D5) operated primarily in that mode. Consequently, with protection networks 20 and 22 and with diode D5 the gate insulators of transistors P1 and/or N1 are protected over a wide range of stressing signals as discussed below with reference to FIGS. 1 and/or 2.

When $V_{in}$ is more positive than the potential on line 12 ($V_{12}$) current flows from the input terminal through diode D11 to line 12. If the current through diode D11 is very large, the voltage drop across the diode increases and some current also flows through resistor R1 and diode D12 to line 12. This maintains the voltage between the input terminal and line 12 to a maximum of a few volts ($V_{FM}$) above $V_{DD}$ even for relatively large currents. The voltage across the gate insulator, $V_{OX}$ or $V_{GS}$, of transistor P1 is thus limited. Similarly, the $V_{GS}$ of transistor N1 is limited to a value whose magnitude is equal to [$V_{FM} + V_{DD} - V_{SS}$].

If $V_{in}$ is positive with respect to $V_{14}$ and is of greater amplitude than $V_{R5}$ of diode D5 plus the $V_{BE}$ of diodes D11–D12, current flows from the input terinal 5 into line 12 and then through diode D5 which breaks down and conducts current in the reverse direction onto line 14. For this signal condition, the potential between the terminls and line 14 is limited to the $V_F$ of diodes D11, D12 plus $V_{R5}$ and the potential across the gate insulator of transistor N1 is limited to $V_{FM}$ volts plus $V_{R5}$ volts.

When $V_{in}$ is positive with respect to the potential (V9) at the output terminal 9 and is of greater amplitude than $V_{R5}$ plus 2 $V_{BE}$ drops, current flows from input terminal 5 through diode D11 and through resistor R1 and diode D12 to line 12. Diode D5, which breaks down, passes current in the reverse direction from line 12 into line 14. From line 14 the current flows through diode D32 into terminal 9. If the current is sufficiently large, some current also flows through diode D31 and resistor R2 into the output terminal. For this signal condition, the potential differential between the input and output terminals is limited to $V_F$ across the combination of diodes D11, D12 plus the $V_F$ across the combination of diodes D31, D32 plus $V_{R5}$. Assuming $V_F$ of the D11, D12 combination and the $V_F$ of the D31, D32 combination to be less than 5 volts and $V_R$ to be 25 volts, the stress potential between terminals 5 and 9 would then be 35 volts. Thus, the voltage across the gate insulator of transistor P1 and N1 is limited, even at relatively high currents to a value which is below the rupture point of the gate insulator, which is typically 100 volts.

For the signal condition ($V_{in}$ greater than V9) diodes D41 and/or D42 are effectively in parallel with diodes D5 which is in series with diodes D32 and/or D31. Since diodes D42 and/or D41 have low current $V_R$ of similar value to D5, they will conduct in the reverse direction. However, as soon as some conduction takes place through diodes D42 and/or D41, the potential between line 12 and terminal 9 exceeds the $V_R$ of diode D5 plus the $V_F$ of diodes D31–D32. Thus, the combination of D5 and D31–D32 provides the primary conduction path between terminals 12 and 9. Thus, protection diodes D41, D42 do not conduct substantial currents in the reverse direction, although they do aid in carrying some of the current.

When $V_{in}$ is negative with respect to terminal 14 or terminal 12 or terminal 9, the protection circuitry, behaves in an analogous fashion to that just described. When $V_{in}$ is sufficiently negative with respect to terminal 9 current flows primarily through diodes D42 and/or D41 conducting in the forward direction, then through diodes D5 conducting in the reverse direction and then through diodes D21 and/or D22 conducting in the forward direction. As before, the potential between terminal 9 and line 12 is limited to the $V_F$ of a diode (or two diodes essentially in parallel) conducting in the forward direction. The potential between terminals 12 and 14 is thus limited, primarily, to the $V_R$ of diode D5, and the potential between terminals 14 and 5 is limited to the $V_F$ of a diode (or two diodes essentially in parallel) conducting in the forward direction.

In the circuit of FIG. 1 a high degree of symmetry exists in the protection networks connected to the input and output terminals and in the operation of the protection network. This symmetrical type of structure and operation is due to the recognition that with respect to the problem of electrostatic charge and discharge any one of the terminals of the circuit may be charged positively or negatively and any one of the other terminals may be at a different potential. The symmetry of the protection circuit also helps in the protection of the components comprising the protection circuit since the potential across them is also limited.

The recognition of this problem pinpoints the need for protecting the output as well as the input and results in a protection network connected to the output terminal. In contrast to the prior art circuitry, it is evident that excessive potential stress between any two terminals of the circuit must be prevented.

In the circuit of FIG. 1 a single complementary inverter is shown. However, it should be evident that the drains of IGFETs P1 and N1 could be connected in circuit to other IGFETs whose drains would then be connected to the output terminal or terminals. Also, the circuit of FIG. 1 shows the gates of IGFETs connected to the input terminal, but it should be evident that the source or the drain could be connected to the input and the gate to an internal circuit point. For it is the stress between the gate and the source/drain/substrate which appears across the gate insulator.

What is claimed is:

1. In combination with an insulated-gate field-effect transistor (IGFET) circuit having an input node, having an output node to which the drain of an IGFET is connected, and having first and second power terminals between which are coupled the source-to-drain path of an IGFET, a protection circuit comprising:

an input terminal and an output terminal;

means connecting said input node to said input terminal;

means connecting said output node to said output terminal;

first, second, third, fourth and fifth diodes extrinsic to said IGFETs, each of said diodes having an anode and a cathode and each having a forward voltage drop ($V_F$) when conducting current in the forward direction and having a reverse breakdown voltage drop ($V_R$) when conducting current in the reverse direction which is significantly greater than its $V_F$, and wherein the $V_F$ and the $V_R$ of said fifth diode is less than the $V_F$ and the $V_R$, respectively, of the first, second, third or fourth diode for the same value of current therethrough;

means connecting the anode of said first diode and the cathode of said second diode to said input terminal;

means connecting the anode of said third diode and the cathode of said fourth diode to said output terminal;

means connecting the cathodes of said first and third diodes to said first power terminal;

means connecting the anodes of said second and fourth diodes to said second power terminal; and means connecting the cathode of said fifth diode to said first terminal and its anode to said second terminal.

2. The combination as claimed in claim 1 wherein said means connecting said output node to said output terminal includes a current limiting resistor.

3. The combination as claimed in claim 2 wherein said protection circuit further includes at least one additional diode extrinsic to said IGFET connected between said output node and one of said first and second power terminals.

4. The combination as claimed in claim 3 wherein said means connecting said input node to said input terminal includes a current limiting resistor and wherein said protection circuit further includes at least one additional diode extrinsic to said IGFET connected between said input node and one of said first and second terminals.

5. The combination as claimd in claim 1 wherein said means connecting said output node to said output terminal is comprised of a first region of first conductivity type diffused in a second region of second, opposite, conductivity type, said first region being connected at one end to said output node and at its other end to said output terminal for providing current limiting therebetween; and means connecting said second region to one of said first and second terminal whereby the junction between said first and second regions forms one of said third and fourth diodes.

6. The combination as claimed in claim 6 wherein said IGFET circuit includes two IGFETs of complementary conductivity type connected at their drains to said output node and wherein the gates of two IGFETs of complementary conductivity type are connected to said input node; and wherein said means connecting said input node to said input terminal includes an elongated region of one of said first and second conductivity type diffused in a region of the other one of said first and second conductivity type and means connecting one end of said elongated region to said input node and the other end of said elongated region to said input terminal, wherein said region of the other one of said first and second conductivity type is connected to one of said first and second power terminals; and further including an additional diode connected between said input node and the other end of said first and second power terminal.

7. In combination with a circuit having an input terminal, an output terminal, and first and second power terminals for the application therebetween of an operating potential and wherein said circuit indluces an IGFET whose source-to-drain path is connected between said power terminals, and also includes an IGFET having its drain connected to said output terminal and its substrate connected to one of said first and second terminals wherein its drain-to-substrate region forms an intrinsic diode which can provide a current carrying path between said one of said first and second terminals and said output terminal, said current carrying path having a relatively large resistance, an improved protection circuit comprising:

a diode extrinsic to the IGFETs of said circuit, said extrinsic diode characterized in that it has substantially less series impedance than said intrinsic diode; and means connecting extrinsic diode between said output of said circuit and said one of said first and second terminals poled in the same direction as said intrinsic diode for limiting the potential between said output terminal and said one of said first and second terminals to a lower value than can be achieved by means of said intrinsic diode for the same value of current therethrough.

8. The combination as claimed in claim 5 wherein the other one of said third and fourth diodes includes a third region of second conductivity type diffused in a region of first conductivity type, said third region being connected to said output terminal and said last named region of first conductivity type being connected to the other one of said first and second power terminals than the one to which said second region is connected.

* * * * *

UNITED STATES PATENT OFFICE
CERTIFICATE OF CORRECTION

PATENT NO. : 4,066,918
DATED : January 3, 1978
INVENTOR(S) : Robert Charles Heuner et al It is certified that error appears in the above-identified patent and that said Letters Patent are hereby corrected as shown below:

Column 4 line 27 the word "region" should be --- regions ---.

Column 4 line 42 after the word "substrate" a --- ) --- should be added.

Column 6 lines 11 and 12 delete the word "extrinsic".

Column 6 line 13 insert after the word "the" --- extrinsic ---.

Column 9 line 21 claim 6 as printed should be claim 7.

Column 10 line 3 claim 7 as printed should be claim 8.

Column 10 line 29 claim 8 as printed should be claim 6.

Signed and Sealed this

Sixth Day of June 1978

[SEAL]

Attest:

RUTH C. MASON
Attesting Officer

DONALD W. BANNER
Commissioner of Patents and Trademarks